TRANSMITTER OUTPUT TRANSISTOR BURNOUT PROTECTION
Filed Dec. 4, 1963
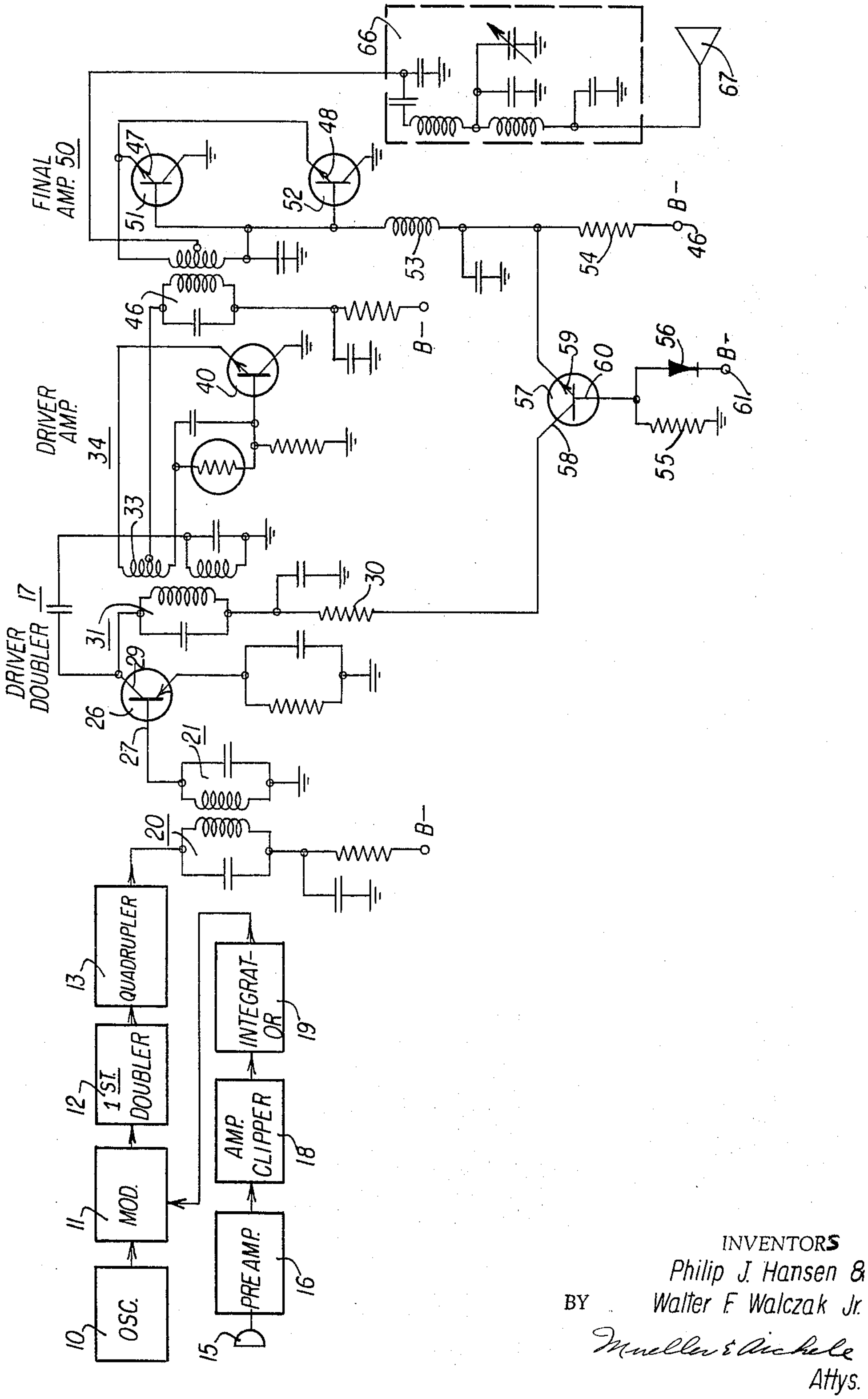
INVENTORS
Philip J. Hansen &
BY Walter F Walczak Jr.
Mueller & Aichele
Attys.

United States Patent Office 3,281,697
Patented Oct. 25, 1966

3,281,697

TRANSMITTER OUTPUT TRANSISTOR BURNOUT PROTECTION

Philip J. Hansen and Walter F. Walczak, Jr., Chicago, Ill., assignors to Motorola, Inc., Franklin Park, Ill., a corporation of Illinois Filed Dec. 4, 1963, Ser. No. 328,032
3 Claims. (Cl. 325—151)

This invention relates to circuits for protection of transistors and in particular to the protection of the output transistors of a miniature carrier wave transmitter.

The development of transistors and other semiconductor components have made possible the miniaturization of many electronic devices. One such device is a hand-held radio transmitter. However, in order to achieve maximum efficiency of operation, it is necessary to operate the transistors of the miniature transmitter at their maximum ratings. This particularly applies to the power amplifier stages of the transmitter.

When such a miniature transmitter is operated in the vicinity of high powered transmitters, the signal from the nearby transmitters may induce voltages on the antenna of the miniature transmitter. This received voltage may be coupled back to the output transistors and added to the radio frequency voltage normally found at this point. This can occur even though the nearby high powered transmitter is transmitting on a different frequency than that to which the miniature transmitter is tuned. Since the voltage applied to the final amplifier stages of the miniature transmitter is as high as the rating of the transistor will permit, the addition of the voltage induced on the antenna will cause the voltage appearing at the output of the power amplifier transistor to exceed its maximum rating and the transistor may break down. When the transistor breaks down heavy current flows through the transistor causing it to burn out. Prior art devices which protect transistors from excessive current are slow in their response to the overcurrent condition and some are self-destructive in operation.

It is therefore an object of this invention to provide a non-linear amplifier with a protective device which will limit the current supplied to the amplifier to a safe value and maintain the amplifier output at a high level.

Another object of this invention is to provide a non-linear amplifier with a protective device which will not be destroyed in limiting the current supplied to the amplifier.

Another object of this invention is to provide a non-linear amplifier with a protective device which will respond rapidly to a condition where the current in the amplifier exceeds the maximum current rating of the amplifier to limit the current to a safe value.

A feature of this invention is the provision of a non-linear amplifier stage with a current sensing device coupled to the amplifier to develop a control voltage proportional to the average direct current supplied to the amplifier. The control voltage is used to control the amplitude of the input signal to the amplifier from a preceding stage to thereby control the current in the amplifier.

Another feature of this invention is the provision of an amplifier driver stage with a transistor control stage to control the amplitude of the output signal of the driver stage in response to a control voltage applied to the transistor control stage.

The invention is illustrated in the drawing which is a partial block diagram and partial schematic of a transmitter circuit incorporating the features of this invention.

In practicing this invention a miniature transmitter is provided including a non-linear transistorized output stage. The signal applied to the non-linear amplifier output stage from a driver stage is controlled to limit the average current in the amplifier stage. The average current in a non-linear amplifier, as for example a class C amplifier, is proportional to the input signal applied thereto. A voltage is developed across a resistor in the supply to the output stage which is proportional to the average current in the non-linear amplifier stage. This voltage is used to control the conduction of a transistor to control the current applied to a driver stage. The amplitude of the output signal from the driver stage is controlled in such a manner that an increase in the current drawn by the amplifier stage will result in a decrease in the drive signal applied thereto. The reduction of the drive signal acts to reduce the average current in the amplifier to protect the transistor of the amplifier output stage.

A partial schematic and partial block diagram of a transmitter circuit incorporating the features of this invention is shown in the drawing. An alternating current of the desired frequency is generated by oscillator 10 and coupled to modulator 11. The output of microphone 15 is coupled to pre-amplifier 16. The resulting signal is amplified and clipped in amplifier-clipper 18 and integrated in integrator 19. The output of integrator 19 is coupled to modulator 11 to frequency modulate the signal generated by oscillator 10. The frequency of the signal from modulator 11 is doubled by first doubler 12 and the resulting frequency is quadrupled in quadrupler 13. The output of quadrupler 13 is applied to transistor 26 of driver-doubler 17 through tuned circuits 20 and 21. The output of driver-doubler 17 is coupled to transistor 40 of driver-amplifier 34 through tuned circuits 31 and 33. The output of driver amplifier 34 is coupled to final amplifier stage which consists of two transistors 51 and 52, connected in parallel. The output of the final amplifier stage is coupled to antenna 67 through tuned circuit 66.

Strong signals from nearby transmitters picked up by antenna 67 can be coupled back to the emitters 47 and 48 of transistors 51 and 52 through tuned circuit 66. The voltage developed by the signals picked up by antenna 67 can be sufficiently large so that when added to the voltage normally present at the emitters 47 and 48 of transistors 51 and 52, voltage breakdown of these transistors can result. When the transistors break down they draw a heavy current which, if permitted to continue, can cause their destruction. To prevent this a current limiting stage has been incorporated to limit the current which can be drawn by transistors 51 and 52.

In this example transistors 51 and 52 are biased to class C operation. In class C operation, the average current drawn by the transistors 51 and 52 is proportional to the input drive signal to the transistors. The output power developed is also a function of the current taken by transistors 51 and 52. Thus if the transistors are operated at or near their maximum current rating, they will develop maximum output power. The voltage supply to transistors 51 and 52 is coupled from the B— terminal 46 through resistor 54 and choke 53 to the base and emitter of the transistors. The voltage drop across resistor 54 is a measure of the current drawn by the final amplifier 50.

Power for the operation of driver-double 17 is coupled from resistor 54 through transistor 57. Emitter 59 of transistor 57 is coupled to one terminal of resistor 54 and collector 58 of transistor 57 is coupled to collector 29 of transistor 26 through decoupling resistor 30 and tuned circuit 31. A fixed bias is applied to the base 60 of transistor 57 through resistor 55 and diode 56 coupled to B— terminal 61. The base to emitter bias of transistor 57 will control the conduction between the emitter and collector electrode thereof to in turn control the current supplied to the driver-double stage 17, and therefore the strength of the output signal from this stage.

In operation the average current through the transistors 51 and 52 of the final amplifier stage 50 is proportional to the amplitude of the input signal from driver-amplifier stage 34. The amplitude of this input signal is proportional to the signal applied to driver-amplifier stage 34 from driver-doubler 17. By controlling the amplitude of the output signal developed in driver-doubler stage 17 the power output of the amplifier 50 is controlled and thus the average current through transistors 51 and 52 is controlled.

The amplitude of the output signal from driver-doubler 17 is controlled by the bias voltage applied to transistor 57, which regulates the current applied to collector 29 of transistor 26. The bias voltage applied to transistor 57 is a function of the voltage developed across resistor 54, which is proportional to the current drawn by the final amplifier stage 50. If the current drawn by amplifier stage 50 increases, the voltage drop across resistor 54 also increases and the voltage applied to emitter 59 of transistor 57 becomes more positive. The increase in the voltage applied to emitter 59 of transistor 57 biases transistor 57 so that it becomes less conductive. This in turn limits the current supplied to driver-double stage 17 causing the amplitude of the output signal from this stage to decrease and thus the input signal applied to the amplifier 50 decreases. Since amplifier 50 is operating as a class C amplifier, its output current will decrease as the input signal is decreased. Thus the action of the current limiter transistor 57 and the resistor 54 limits the amplifier current in amplifier stage 50 by reducing the drive signal applied to the stage. The current limiting action prevents output transistors 51 and 52 from being damaged because of excessive current.

While the amplifier used in this example is a class C amplifier the invention is not limited to this condition of amplifier operation but can be applied to any amplifier operating in a non-linear mode of operation in which the average current through the amplifier is a function of the signal applied thereto.

We claim:

1. In a carrier wave transmitter, a transistor amplifier circuit including in combination, at least one transistor having base, emitter and collector electrodes, said collector electrode being connected to a reference potential, driver means coupled to said base electrode for supplying a driver output signal of predetermined amplitude thereto, said transistor circuit having an average direct current output current therein proportional to said predetermined driver output signal amplitude, antenna circuit means coupled to said emitter electrode, said emitter electrode applying output signals to said antenna circuit means for radiation thereby, and said antenna circuit means being susceptible to picking up signals from other transmitters which may be present and applying the same to said collector electrode, power supply means, resistance means coupling said power supply means to said emitter electrode, said resistance means being responsive to said average output current to develop a control voltage, current control means coupled to said resistance means and said driver means for supplying current to said driver means, said current control means being responsive to said control voltage to limit the current in said driver means to thereby control the amplitude of said driver output signal whereby the average output current in said amplifier means is controlled.

2. In a carrier wave transmitter, a transistor amplifier circuit including in combination, a transistor having input and output circuit means, antenna circuit means, said output circuit means applying first signals to said antenna circuit means for radiation thereby, and said antenna circuit means being susceptible to picking up second signals from other transmitters which may be present and applying said second signals to said output circuit means, whereby said first and second signals add to produce a voltage greater than the breakdown voltage of said transistor, driver means, means coupling said input circuit means to said driver means for receiving a driver output signal of predetermined amplitude therefrom, said transistor amplifier having an average direct current output current therein proportional to said predetermined driver output signal amplitude, power supply means, resistance means coupling said power supply means to said output circuit means, said resistance means being responsive to said average output current to develop a control voltage, current control means coupled to said resistance means and said driver means for supplying current to said driver means, said current control means being responsive to said control voltage to limit the current in said driver means to thereby control the amplitude of said driver output signal whereby the average output current in said transistor amplifier is controlled.

3. A current limiting circuit including in combination, driver means providing a driver output signal of predetermined amplitude, amplifier means having an input terminal coupled to said driver means for receiving said driver output signal therefrom and an output terminal, said amplifier means having an average direct current output current therein proportional to said predetermined driver output signal amplitude, power supply means, resistance means coupling said power supply means to said output terminal for supplying said average direct current output current to said amplifier means, said resistance means being responsive to said average output current to develop a control voltage, current control means including a transistor having base, emitter and collector electrodes, first circuit means coupling said emitter electrode to said resistance means for applying said control voltage thereto and for providing an operating current for said driver means, second circuit means coupling said collector electrode to said driver means for supplying said operating current thereto, and third circuit means coupling said power supply means to said base electrode for supplying a bias potential thereat, said current control means being responsive to said control voltage to regulate the magnitude of said operating current in said driver means to thereby control the amplitude of said driver output signal whereby the average output current in said amplifier means is controlled.

References Cited by the Examiner

UNITED STATES PATENTS

| | | | |
|---|---|---|---|
| 2,572,832 | 10/1951 | Bernard | 328—10 |
| 3,013,148 | 12/1961 | DeLong et al. | 325—186 X |
| 3,102,241 | 8/1963 | Johnstone | 330—29 X |

DAVID G. REDINBAUGH, *Primary Examiner.*

JOHN W. CALDWELL, *Examiner.*